United States Patent [19]

Hammerschmidt et al.

[11] Patent Number: 5,631,496

[45] Date of Patent: May 20, 1997

[54] SEMICONDUCTOR COMPONENT HAVING A PASSIVATION LAYER AND METHOD FOR MANUFACTURING SAME

[75] Inventors: Albert Hammerschmidt, Erlangen; Gerhard Schmidt, Forchheim; Rolf Schulte, Erlangen, all of Germany

[73] Assignees: Eupec Europaelsche Gesellsch. F. Leistungshalbleiter MBH & Co.KG, Warstein-Belecke; Siemens Aktiengesellschaft, Munich, both of Germany

[21] Appl. No.: 537,029

[22] Filed: Sep. 29, 1995

Related U.S. Application Data

[63] Continuation of Ser. No. 242,198, May 13, 1994, abandoned.

[30] Foreign Application Priority Data

May 13, 1993 [DE] Germany .................. 43 16 121.9

[51] Int. Cl.$^6$ .................................................. H01L 23/58
[52] U.S. Cl. ...................... 257/632; 257/642; 257/651
[58] Field of Search ........................ 257/77, 642, 646, 257/651, 632

[56] References Cited

U.S. PATENT DOCUMENTS

| | | | |
|---|---|---|---|
| 5,039,358 | 8/1991 | Birkle et al. | 437/101 |
| 5,094,915 | 3/1992 | Subramaniam | 428/408 |
| 5,330,616 | 7/1994 | Yamazaki | 156/643 |

FOREIGN PATENT DOCUMENTS

OS4013435  12/1990  Germany .

OTHER PUBLICATIONS

"Characteristics and Boron doping Effect of Hydrogenated Amorphous Carbon Films," Noda et al., *J. Appl. Phys.*, vol. 60, No. 4, Aug., 1986, pp. 1540–1542.

Derwent Abstract AN 87–069228 for Japanese Application 6203050 (Jan. 31, 1987).

*Primary Examiner*—J. Carroll
*Attorney, Agent, or Firm*—Hill, Steadman & Simpson

[57] ABSTRACT

A semiconductor component has a semiconductor body with at least on pn-junction therein, extending to the surface of the semiconductor body, and has a passivation layer composed of boron-doped, amorphous, hydrogenous carbon (A-C:H) which covers at least the portion of the pn-junction extending to the surface, the boron content of the passivation layer being between 0.1 per mil and 4% by weight. The passivation layer is manufactured on the semiconductor body by deposition from a high-frequency, low-pressure plasma which is generated in a mixture of gaseous, organic compounds containing carbon and hydrogen and gaseous, organic boron compounds.

4 Claims, No Drawings

SEMICONDUCTOR COMPONENT HAVING A PASSIVATION LAYER AND METHOD FOR MANUFACTURING SAME

This is a continuation of application Ser. No. 08/242,198, filed May 13, 1994 abandoned.

BACKGROUND OF THE INVENTION

1. Field of the Invention

The present invention is directed to a semiconductor component having a passivation layer and to a method for manufacturing such a semiconductor component, and in particular to a semiconductor component having a passivation layer composed of boron-doped amorphous, hydrogenous carbon (a-C:H).

2. Description of the Prior Art

Semiconductor components are known having a semiconductor body with at least pn-junction therein extending to the surface of the semiconductor body, and having a passivation layer composed of boron-doped amorphous, hydrogenous carbon (a-C:H) which covers at least that portion of the pn-junction extending to the surface of the semiconductor body. Such a semiconductor component is disclosed, for example, in German OS 40 13 435. This document discloses that amorphous, hydrogenous, boron-doped carbon (a-C:H) can be employed as a passivation layer in addition to boron-doped silicon which is vapor-deposited in a vacuum. Such a layer of amorphous, hydrogenous carbon meets the demands of a passivation layer rather well. It exhibits a specific resistance which is higher than $10^8$ ohm/cm, a density of states which is approximately $10^{19}$ cm$^{-3}$ eV$^{-1}$, and a thermal loadability up to 290° C. Moreover, such a passivation layer affords good protection against moisture. Such a known passivation layer, however, exhibits problems in matching the layer to p-doped regions of the semiconductor body. Such matching is not optimum, presumably due to the creation of an inversion layer a decrease in the blocking capability in the conducting direction may arise in thyristors employing such a passivation layer.

SUMMARY OF THE INVENTION

The present invention is directed to a semiconductor component having a passivation layer of the type described above wherein the passivation layer is well-matched to p-doped semiconductor layers.

A further object of the present invention is to provide a method for manufacturing such a semiconductor component.

The above object is achieved in accordance with the principles of the present invention in a semiconductor component having a semiconductor body with at least one pn-junction therein extending to the surface of the semiconductor body, and having a passivation layer which covers at least the portion of the pn-junction extending to the surface, which is composed of boron-doped amorphous, hydrogenous carbon (a-C:H) wherein the boron content is between 0.01 per mil and 4% by weight.

The passivation layer preferably has a density of states above $10^{18}$ cm$^{-3}$ eV$^{-1}$, a specific resistance greater than $10^8$ ohm/cm and a band gap between 0.7 and 1.1 eV. The preferred thickness of the passivation layer is between 0.02 and 3 µm.

DESCRIPTION OF THE PREFERRED EMBODIMENTS

The passivation layer of the invention can be produced, for example, by deposition from a high-frequency, low-pressure plasma which is generated in a mixture of gaseous, organic compounds which contain carbon and hydrogen, and gaseous, organic boron compounds. The pressure can be between 0.05 and 1 mbar. The power density can be between 0.5 and 10 W/cm$^2$. A self-bias of approximately −800 through −900 V arises as a superimposed d.c. voltage given a corresponding, geometrical design of the deposition reactor (having a ratio of the areas of the anode to the cathode which is greater than 2:1). The plasma can alternatively be excited by microwave radiation.

Methane, ethylene, acetylene, propane or butane may be employed, for example, as the hydrogenous carbon compounds. Other hydrocarbons such as cyclohexane, benzene, tetraline or oxygen-containing organic compounds such as esters or ethers, which are gaseous at the aforementioned deposition pressure, may also be used. Alkanes, alkenes, alkines or arenes are preferably employed since these compounds contain exclusively carbon and hydrogen.

Boric acid esters, carboranes or boranes can be employed, for example as gaseous boron compounds which are added to the gaseous, organic compounds containing carbon and hydrogen. The employment of organic boron compounds is particularly advantageous, because the handling problems associated with boron-hydrogen compounds, such as spontaneous combustion in air, are not present. The use of boric acid ester incorporates oxygen into the passivation layer. This can be advantageous for the passivation properties.

The above-described method for deposition of boron-doped, amorphous, hydrogenous carbon compounds can be modified such that the delivery of the compound containing the carbon is terminated after the deposition of a specific layer thickness. A boron-free layer is thereafter deposited. The ratio of the thicknesses of the boron-containing layer to the boron-free layer can thereby be set in a range of from 0.5:99.5 through 99.5:0.5.

It is beneficial to temper the passivation layer at a temperature between 200° and 350° C. after the deposition. The semiconductor body itself is maintained at a temperature below 300° C. during the deposition.

EXEMPLARY EMBODIMENT

A system for the production of the plasma has two electrodes having different areas, the larger of the electrodes being grounded and the smaller being connected to a high-frequency generator through a matching network. A methane-boric acid trimethylester (B(OCH$_3$)$_3$) mixture is introduced into the reactor at a pressure of 0.2 mbar. The flow ratio is 20:1. The substrate in the form of a semiconductor body of a thyristor, having the known, positively/negatively beveled edge to be coated, is located on the smaller electrode, in this case the cathode. The plasma is now generated by ignition, with the power being selected so that a measured voltage between anode cathode of −800 V (self bias) is set. The specific power required for this purpose is 2.8 W/cm$^2$. The delivery of the boric acid methylester is terminated after a deposition of 2.5 minutes, and pure a-H:C is deposited for a further 2.5 minutes. A layer having a thickness of 0.6 µm, an optical band gap of 0.8 through 0.9 eV, and a density of states of approximately $10^{19}$ cm$^{-3}$ eV$^{-1}$ is thus obtained. The semiconductor bodies coated in this manner are then tempered at 270° C. for three hours. The semiconductor bodies exhibit stable characteristics in the conducting direction. The measured boron content amounted to 0.45% by weight. An oxygen content of approximately 10% by weight was also measured.

Although modifications and changes may be suggested by those skilled in the art, it is the intention of the inventors to embody within the patent warranted hereon all changes and modifications as reasonably and properly come within the scope of their contribution to the art.

We claim as our invention:

1. A semiconductor component comprising a semiconductor body having an n-region and a p-region forming at least one pn-junction therein extending to a surface of said semiconductor body, and a layer for electroactively passivating said surface of said semiconductor body, said layer electrically coupled to and covering at least a part of said pn-junction extending to said surface and composed of boron-doped, amorphous, hydrogenous carbon with a boron content in a range of from 0.01 per mil to 4% by weight and giving said layer a conductivity matched to a conductivity of said p-region.

2. A semiconductor component as claimed in claim 1 wherein said layer has a density of states which is greater than $10^{18}$ cm$^{-3}$ eV$^{-1}$, a specific resistance above $10^8$ ohm/cm and a band gap between 0.7 and 1.1 eV.

3. A semiconductor component as claimed in claim 1 wherein said layer has a thickness in a range between 0.02 and 3 µm.

4. A semiconductor component as claimed in claim 1 wherein said layer contains oxygen in an amount which is less than 15% by weight.

* * * * *